United States Patent [19]

Shenai et al.

[11] Patent Number: 4,985,740
[45] Date of Patent: Jan. 15, 1991

[54] POWER FIELD EFFECT DEVICES HAVING LOW GATE SHEET RESISTANCE AND LOW OHMIC CONTACT RESISTANCE

[75] Inventors: Krishna Shenai, Schenectady, N.Y.; Bantval J. Baliga, Raleigh, N.C.; Patricia A. Piacente; Charles S. Korman, both of Schenectady, N.Y.

[73] Assignee: General Electric Company, Schenectady, N.Y.

[21] Appl. No.: 359,811

[22] Filed: Jun. 1, 1989

[51] Int. Cl.$^5$ ............... H01L 29/100; H01L 27/020; H01L 29/780; H01L 29/040
[52] U.S. Cl. ..................... 357/23.4; 357/41; 357/59; 357/65
[58] Field of Search .............. 357/65, 67, 23.1, 23.4, 357/59 G, 59 I, 41

[56] References Cited

U.S. PATENT DOCUMENTS

| | | | |
|---|---|---|---|
| 4,180,596 | 12/1979 | Crowder et al. | 427/42 |
| 4,356,622 | 11/1982 | Widmann | 357/59 I |
| 4,675,713 | 6/1987 | Terry et al. | 357/23.1 |
| 4,701,996 | 10/1987 | Calviello | 437/44 |
| 4,714,951 | 12/1987 | Baudrandt et al. | 357/59 I |
| 4,769,685 | 9/1988 | MacIver et al. | 357/23.4 |
| 4,794,432 | 12/1988 | Yilmaz et al. | 357/23.4 |
| 4,866,492 | 9/1989 | Quigg | 357/23.4 |
| 4,901,134 | 2/1990 | Misawa et al. | 357/59 I |

FOREIGN PATENT DOCUMENTS

| | | | |
|---|---|---|---|
| 0249370 | 12/1985 | Japan | 357/23.4 |
| 0186476 | 8/1988 | Japan | 357/23.4 |

OTHER PUBLICATIONS

K. Shenai, et al., "A 50 V, 0.7 m $\Omega$-cm$^2$ Vertical Power DMOS FET", General Electric Company, Corporate Research & Development, TIS Report 87 CRD 207, Oct., 1987.

K. Shenai, et al., "Characteristics of As-Deposited and Sintered Mo/LPCVD W Contacts to As, B, and P Doped Silicon", Proceedings of the 1987 Workshop on *Tungsten and Other Refractory Metals for VLSI Applications III*, Materials Research Society, 1988, pp. 219-226.

*Primary Examiner*—Rolf Hille
*Assistant Examiner*—Peter Toby Brown
*Attorney, Agent, or Firm*—Marvin Snyder; James C. Davis, Jr.

[57] ABSTRACT

A multi-cellular power field effect semiconductor device includes a tungsten silicide/polysilicon/oxide gate electrode stack with low sheet resistance. Preferably, a layer of tungsten is also disposed in intimate contact with the source region of the device. This tunsten layer is self-aligned with respect to the aperture in the gate electrode through which the source region is diffused. The presence of this tungsten layer greatly reduces the resulting ohmic contact resistance to the region. If desired, a tunsten layer can also be disposed in contact with the drain region of the device, again, to lower ohmic contact resistance. The device has substantially improved operating characteristics. Novel processes for producing the device are also described.

5 Claims, 12 Drawing Sheets

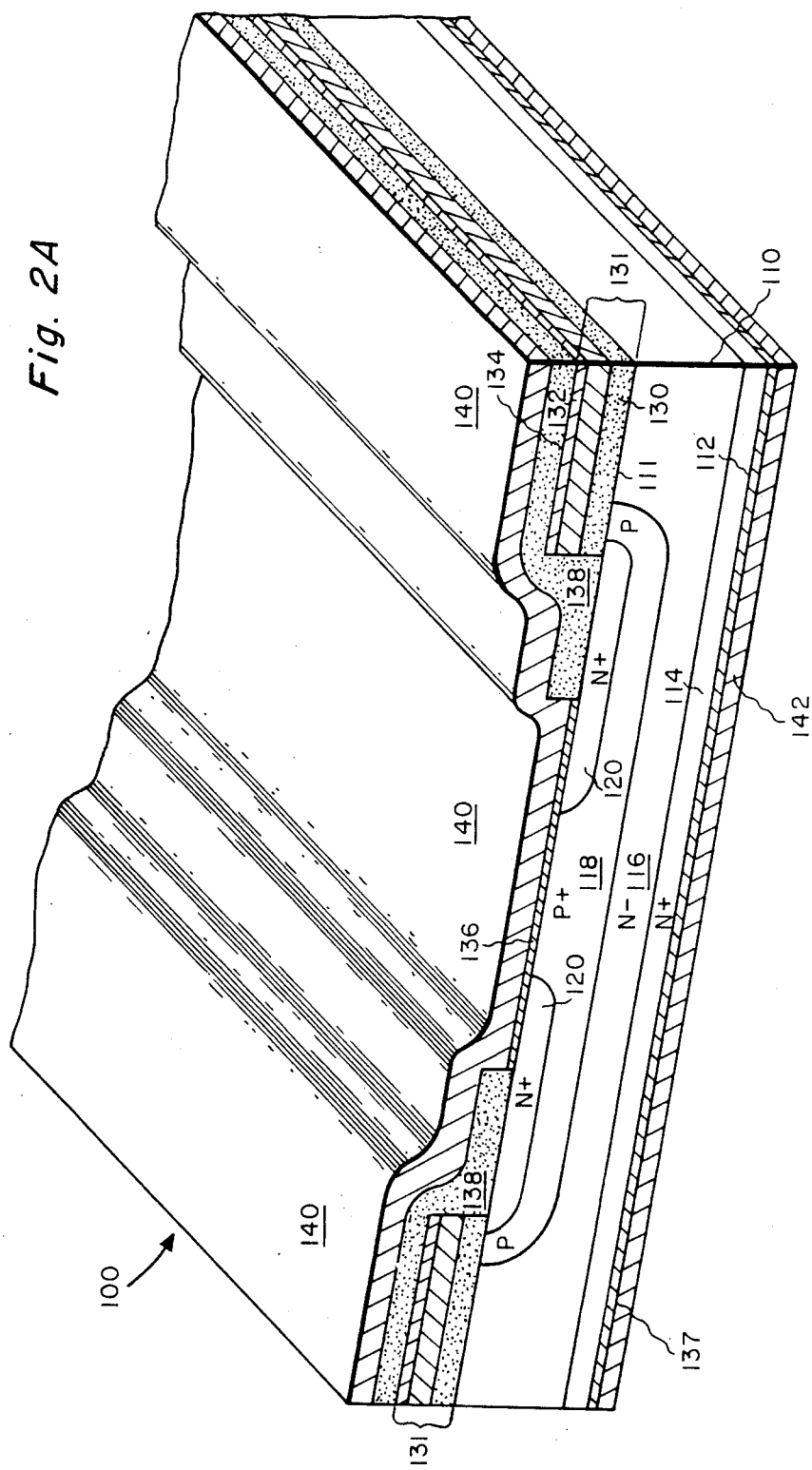

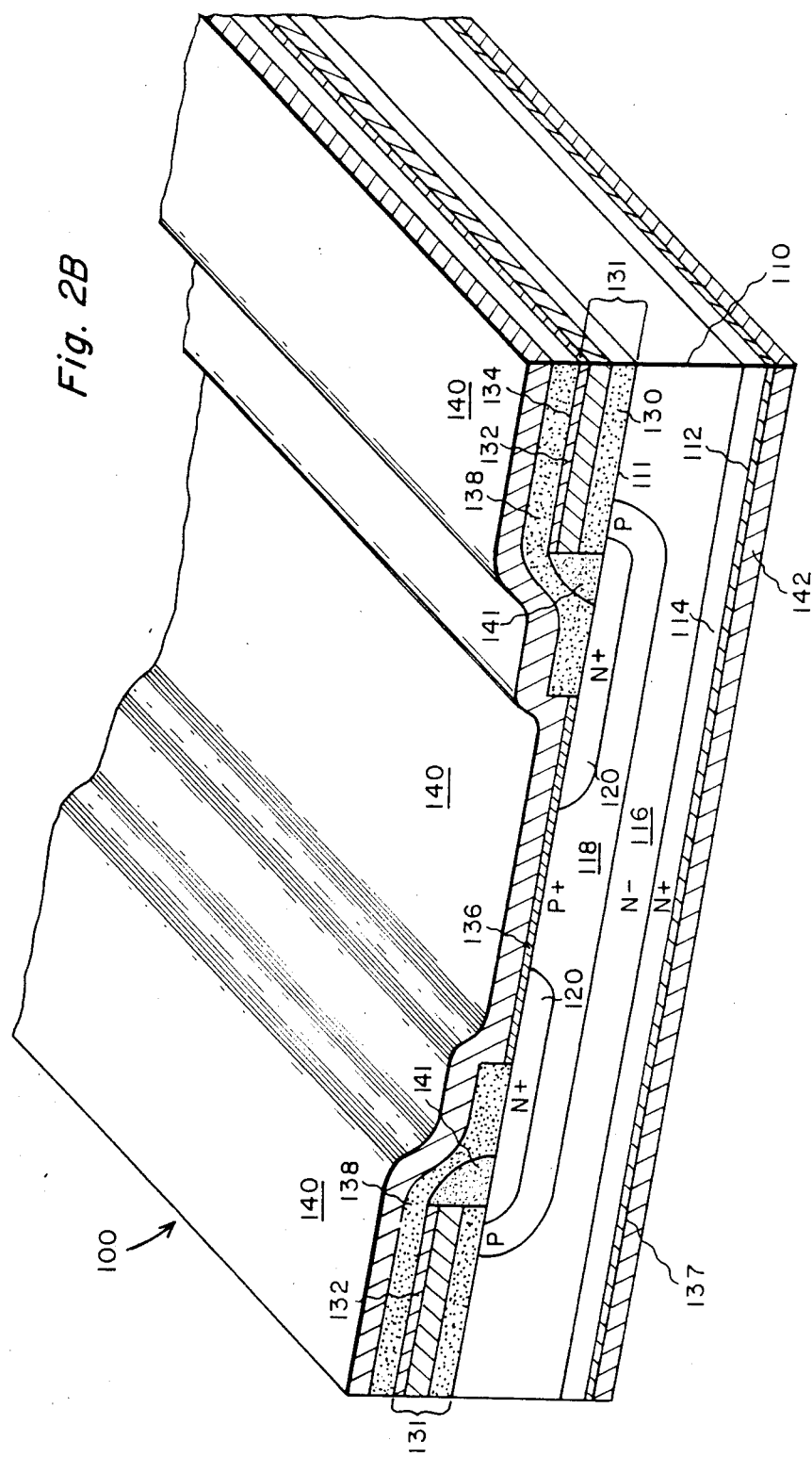

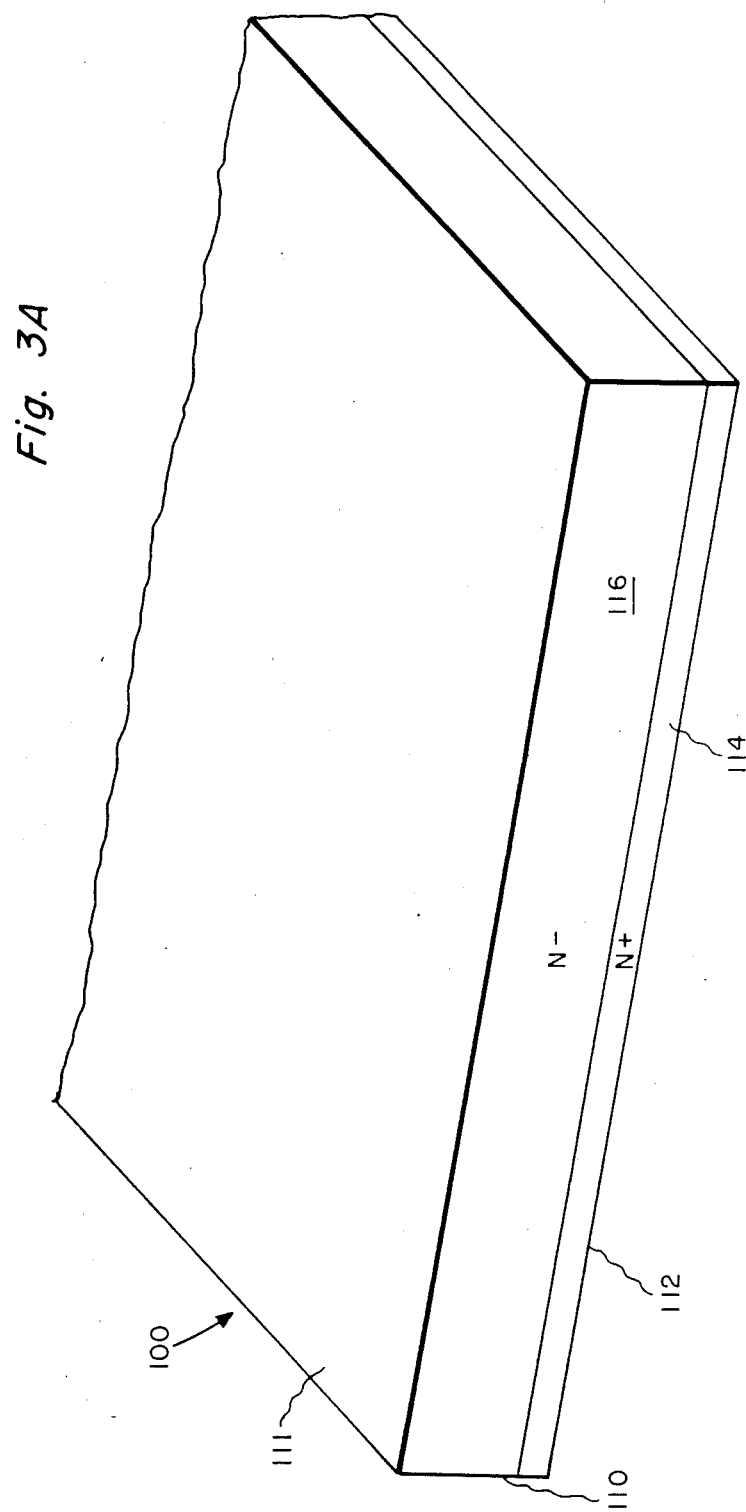

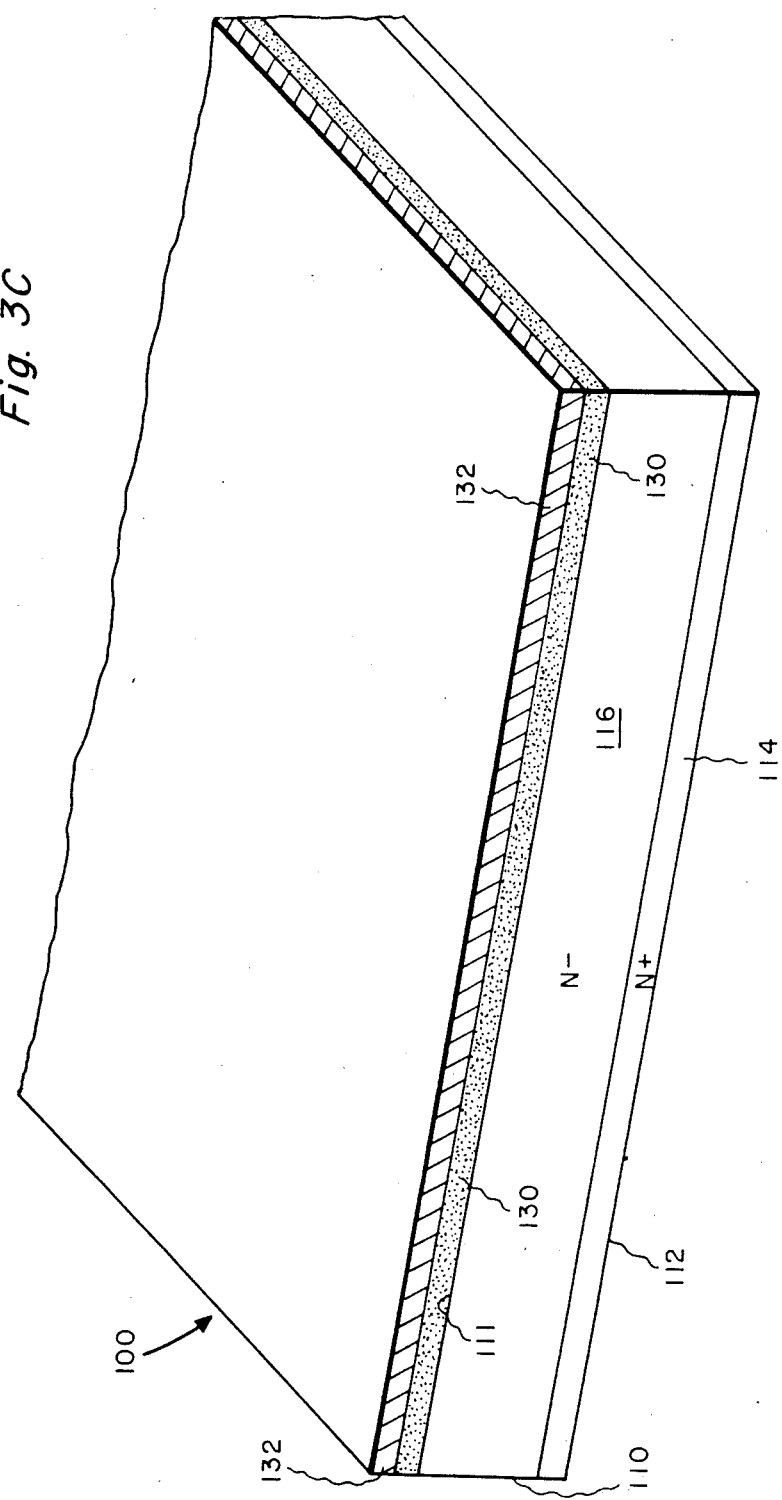

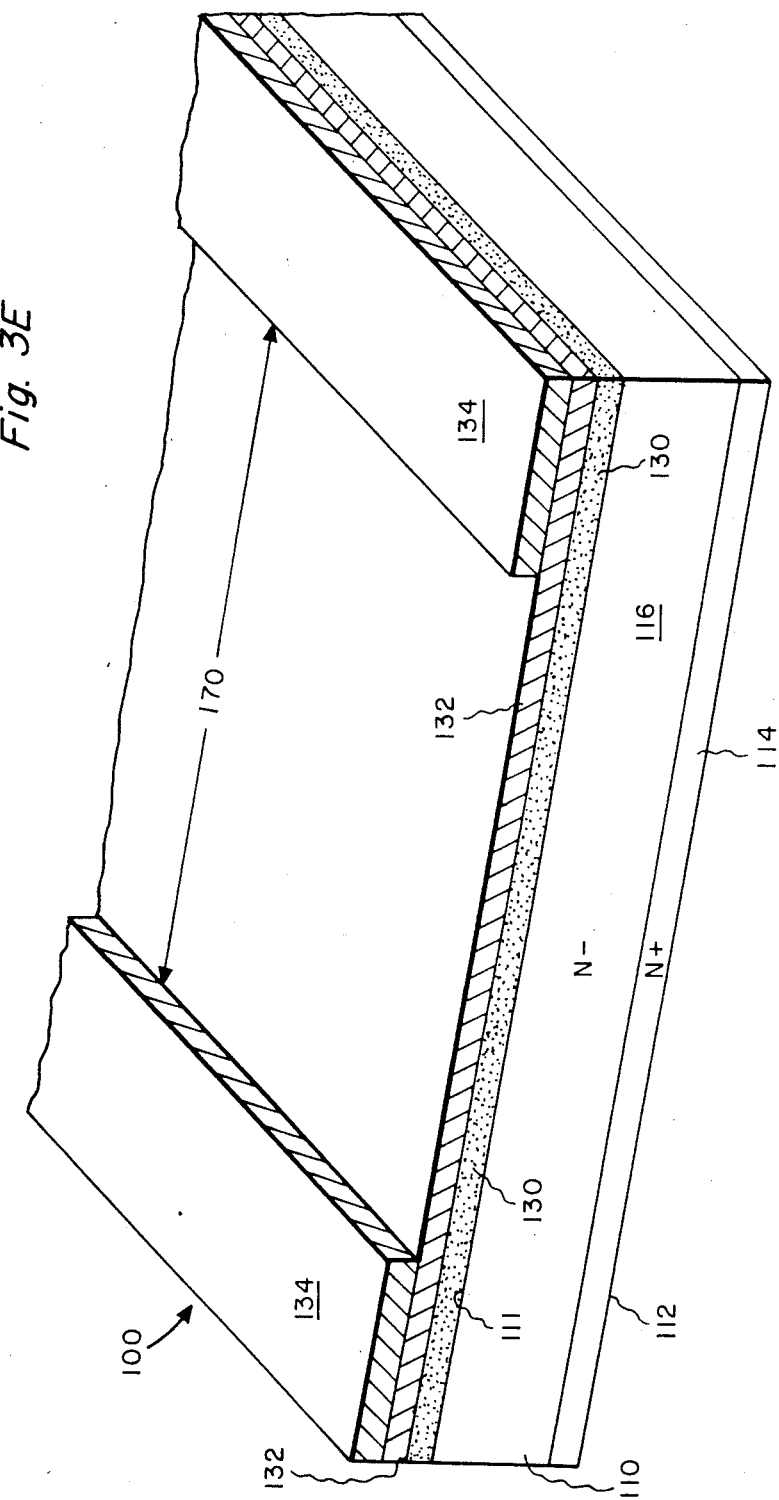

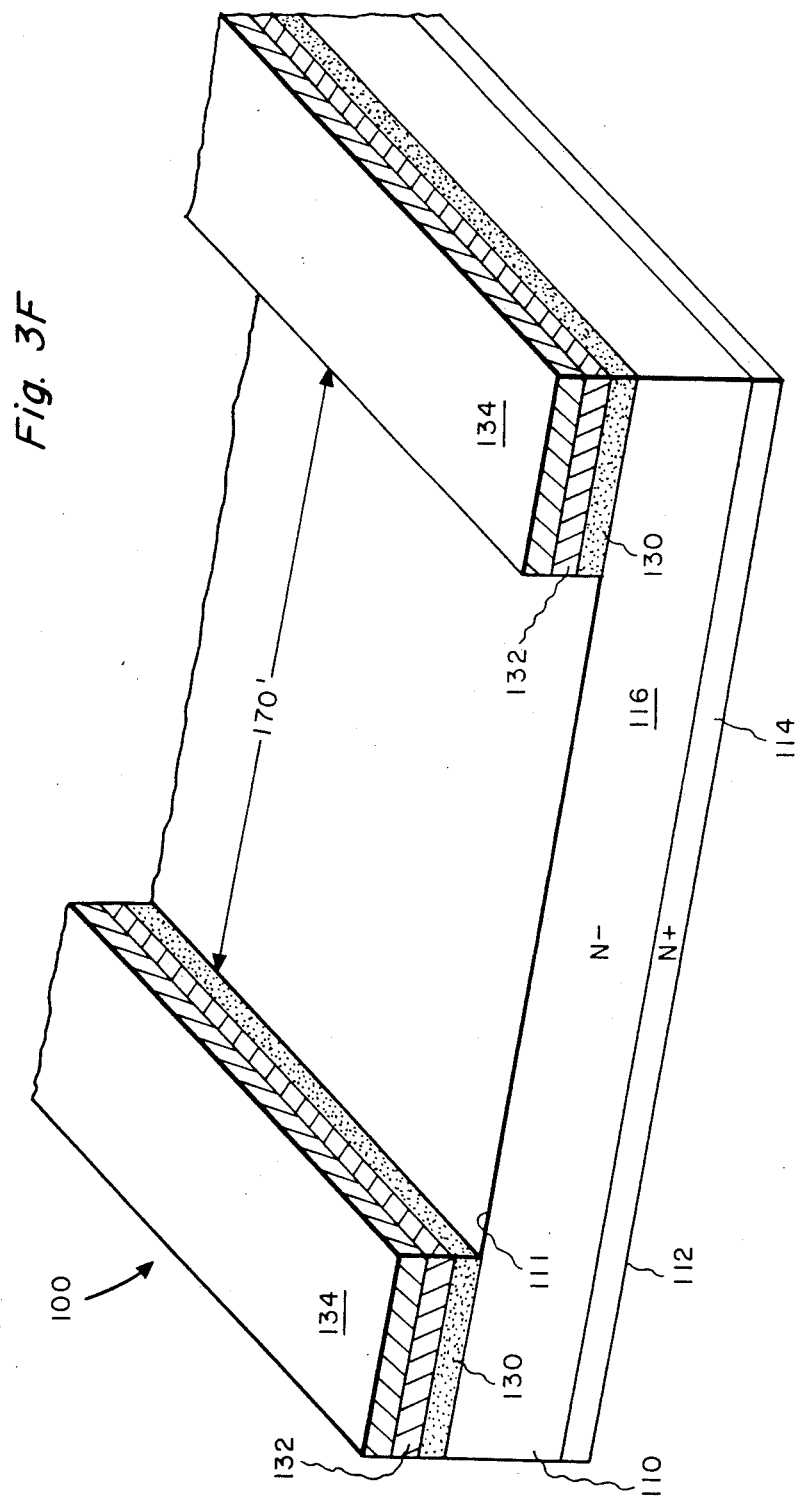

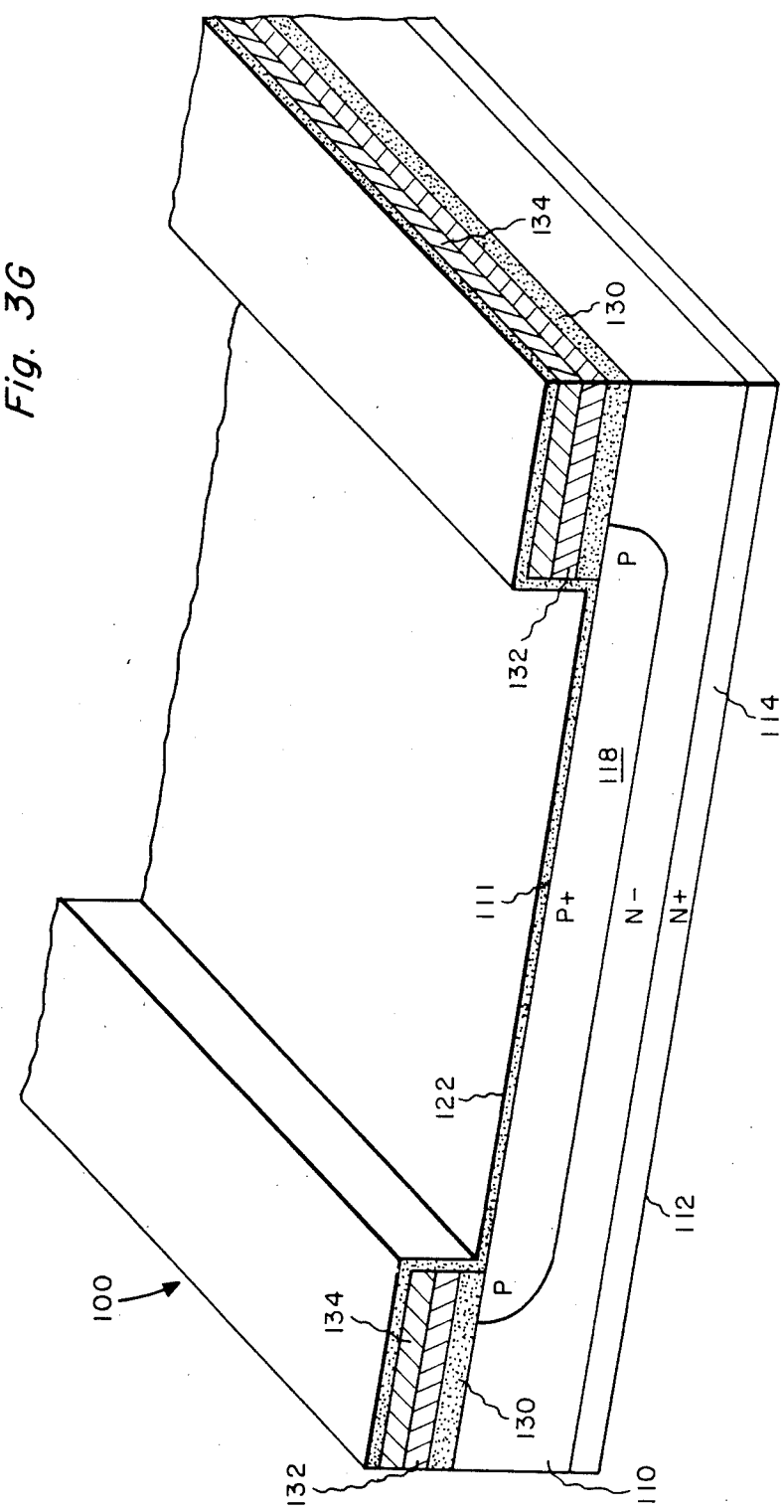

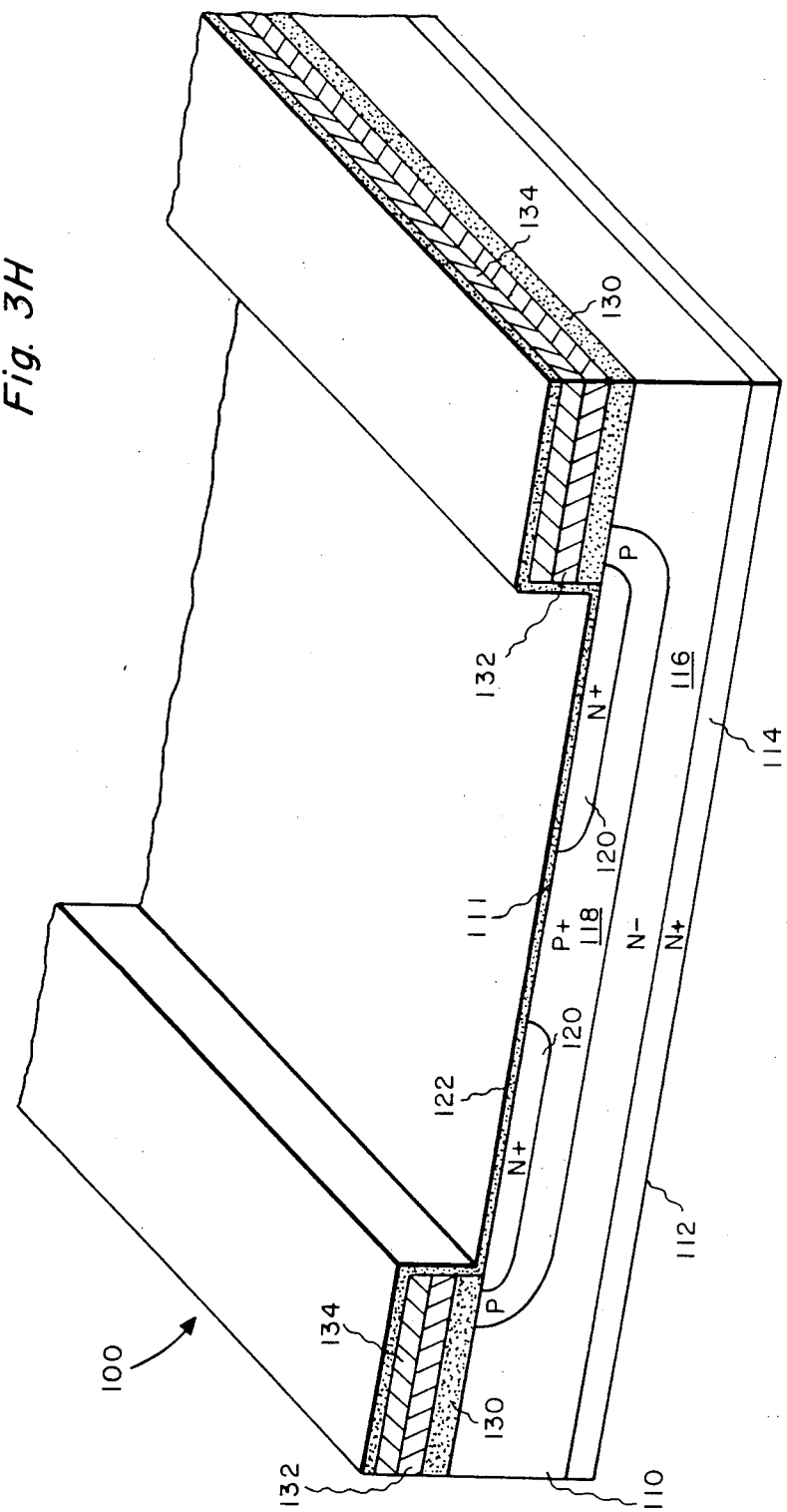

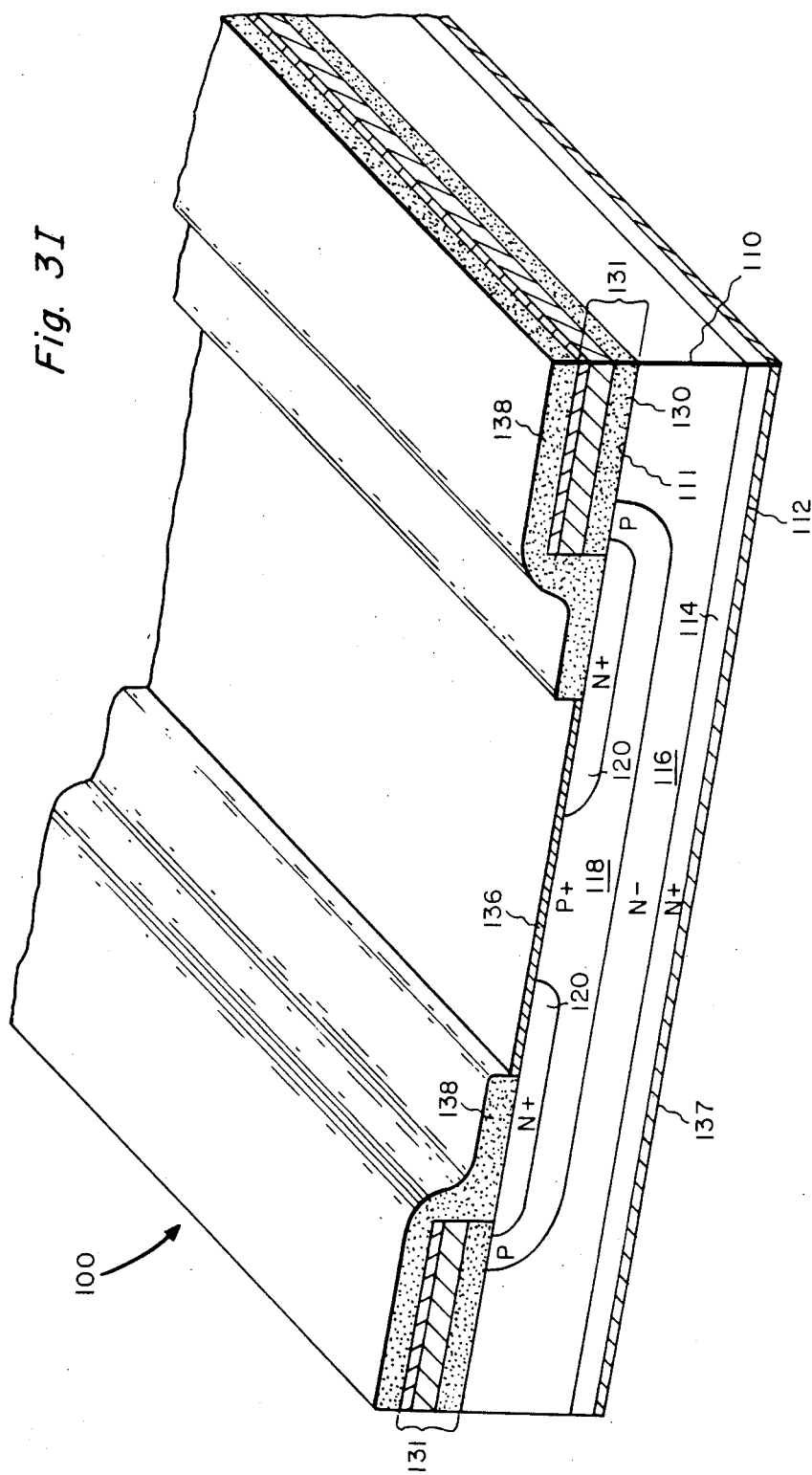

POWER FIELD EFFECT DEVICES HAVING LOW GATE SHEET RESISTANCE AND LOW OHMIC CONTACT RESISTANCE

BACKGROUND OF THE INVENTION

1. Field of the Invention

This invention relates in general to semiconductor devices and methods for fabricating same. More specifically, the invention comprises novel power field effect semiconductor device fabrication methods and structures that include a tungsten silicide/polysilicon/oxide gate stack with low sheet resistance and/or selective low pressure chemical vapor deposited (LPCVD) tungsten layers on the semiconductor wafer to lower ohmic contact resistance.

2. Description of the Prior Art

Gate electrodes in vertical power field effect devices are commonly formed by wet etching or dry etching heavily doped polysilicon/oxide stacks prior to channel and source implantation and diffusion. The lowest attainable gate sheet resistance using this method is typically 20–25 ohms/square, which is due principally to the solid solubility limitation of the dopant (e.g. phosphorous) within the polysilicon layer. For certain applications, such as the high frequency, low voltage power field effect transistors (FETs) discussed below, a gate sheet resistance of 20–25 ohms/square is high and functions to disadvantageously restrict the gate turn-on and turn-off times and results in increased gate switching losses. In addition, non-uniform turn-on and turn-off resistance/capacitance (RC) mechanisms often result which significantly hinder the frequency response of such devices and cause local hot spots.

Over the last several years, switched mode power converter requirements have become more and more sophisticated in order to keep up with the advances being made in high speed very large scale integrated circuits (VLSI) and high density interconnect methods of system packaging. There is presently envisioned a need by some in the industry for low voltage devices (e.g., $V_{BD}=50-100$ volts, or less) capable of use for high frequency (1–5 MHz) power switching applications. Such devices will allow local distribution of power to an integrated circuit. In order to accomplish this goal, however, it is necessary to lower gate sheet resistance (i.e., <20–25 ohms/square) to reduce gate distributed RC propagation delay, improve gate switching efficiency, enhance device reliability, and reduce die size for a given current rating by eliminating long gate runners.

Another barrier to obtaining practical high frequency, low voltage power field effect devices is the significant contribution to on-resistance of the device from the source, gate and drain ohmic contacts. To reduce the on-stage power dissipation and to improve the current handling capability of the device, a low specific on-resistance is desired.

It is known in the semiconductor field effect transistor art to convert the surface of a gate electrode to a metal silicide in order to reduce the resistance of the gate structure to lateral current flow. It is also known in the VLSI art in which external metallization does not contact the source region along its length to silicide the surface of the source region to minimize the source region resistance to current flow along its length. Each of these uses of metal silicide is directed to the specific purpose of increasing the conductivity of a particular silicon region in order that the region itself may have a low resistance to the flow of current along the length thereof. Further, prior uses of metal silicide have required additional processing steps and/or placed processing limitations on device fabrication. For example, additional masking and etching are typically necessary, and once deposited, high temperature drive must be avoided.

Reduction of gate sheet resistance and contact resistance have been long term objectives in which each incremental advance improves device performance and yields a competitive edge. Consequently, as new techniques for reducing gate sheet resistance and/or contact resistance have been developed, they have been widely adopted. Therefore, novel field effect power device fabrication methods and structures which provide significant improvement over heretofore obtainable gate sheet resistance and which provide lowered gate, source and drain ohmic contact resistances are clearly desirable and commercially significant.

SUMMARY OF THE INVENTION

A primary object of the present invention is to improve multi-cellular, field effect power device operating characteristics by reducing gate sheet resistance.

Another object of the invention is to provide a multi-cellular, field effect power device fabrication method and structure with improved on-resistance and lowered ohmic contact resistance.

A further object is to provide more efficient multicellular, field effect power device fabrication methods.

A still further object is to provide an improved high frequency, low voltage, multi-cellular, field effect power device fabrication method and structure.

The foregoing and other objects are accomplished in accordance with the present invention through provision of a field effect semiconductor structure including a tungsten silicide/polysilicon/oxide gate electrode stack. In a preferred embodiment, this structure is combined with a layer of tungsten disposed in ohmic contact with the source and gate regions. The tungsten layer is self-aligned with respect to an aperture in the gate electrode stack which is disposed over and preferably self-aligned with the body and source regions. If desired, a tungsten layer can also be provided at the device drain. The structure is preferably present in each cell of the multi-cellular device. These field effect devices may be FETs, insulated gate bipolar transistors (IGBTs), metal oxide semiconductor controlled thyristors (MCTs) or other field effect power devices in discrete or integrated forms.

Such a device structure may be fabricated in accordance with one embodiment of the invention by (1) oxidizing the surface of a one type conductivity semiconductor wafer to form an oxide layer, (2) depositing a polysilicon layer on top of the oxide layer, (3) depositing a tungsten silicide layer on top of the polysilicon layer, (4) patterning the tungsten silicide/polysilicon/oxide stack to define a gate electrode layer and an aperture therein, (5) forming a body region of opposite type conductivity in the wafer beneath the self-aligning gate electrode aperture, (6) high-temperature diffusion of the p-type body region with a suitable silicide capping layer such as a thermally grown oxide layer on the silicide, (7) etching the capping layer (preferably dry etch) to allow for source region implant, (8) forming a source region of one type conductivity in the body region beneath the self-aligning gate electrode aperture, and (9) driving the source region diffusions in. Further preferred processing steps include (10) growing a thin layer of thermal oxide on the wafer prior to driving the source and body region diffusions, (11) patterning the tungsten silicide/polysilicon/oxide stack using a two step reactive-ion-etching process wherein the silicide layer is etched in a first gas and the balance of the exposed stack is etched in a second gas to define sharp vertical edges, (12) depositing a conformal dielectric layer over the entire upper surface of the wafer, (13) plasma etching the conformal dielectric layer to remove the dielectric layer within the gate layer defined aperture, (14) depositing a layer of tungsten within the window exposed within the gate electrode layer aperture, and (15) depositing a metallization layer over the wafer and in the contact window in a manner to form an ohmic contact between the metallization and the source region within the gate electrode defined aperture.

BRIEF DESCRIPTION OF THE DRAWINGS

The subject matter which is regarded as the invention is particularly pointed out in and distinctly claimed in the concluding portion of the specification. The invention, however, both as to organization and method of practice, together with further objects and advantages thereof, may best be understood by reference to the following description taken in connection with the accompanying drawings in which:

FIGS. 2A and 2B are perspective cross-sectional illustrations of a portion of a multi-cellular device structure in accordance with the present invention; and FIGS. 3A-3I illustrate a method in accordance with the present invention for fabricating the device of FIG. 2.

DETAILED DESCRIPTION OF THE INVENTION

Figure 1:
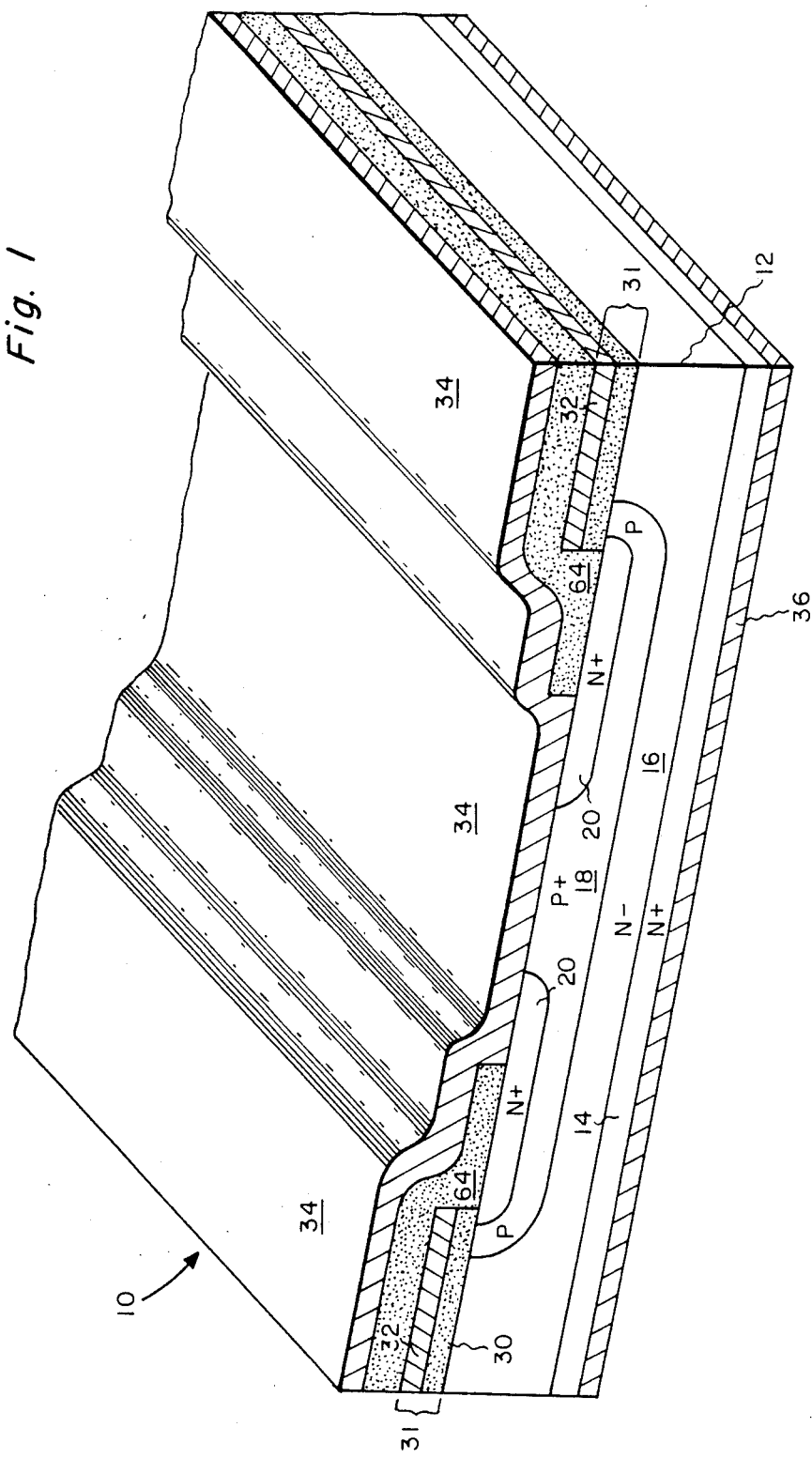
FIG. 1 is a perspective cross-sectional illustration of a portion of a multi-cellular prior art vertical power FET.

FIG. 1 illustrates in a perspective cross section view, a portion of a prior art field effect power semiconductor device 10. The device 10 comprises a body 12 of semiconductor material having upper and lower major surfaces and including an N+ drain layer 14 adjacent its lower surface, and an N− drift region 16 extending from adjacent the drain region 14 to the upper surface of the semiconductor body. A body region 18 of P+ material extends into the drift region from the upper surface of the semiconductor body. A heavily doped N+ source region 20 extends into the body region 18 from the upper surface of the semiconductor material. The source region 20 in the plane of the cut in the figure consists of two separate portions which are locally spaced apart by a portion of the body region 18 which extends to the upper surface of the semiconductor body between the two portions of the source region. An insulated gate electrode 31 is disposed on the upper surface of the semiconductor body and comprises a thermal oxide layer 30 and a polysilicon layer 32. Oxide layer 30 is approximately 500 Å thick and polysilicon layer 32 is close to 6000 Å thick. Layer 32 is POCl$_3$ doped to lower the sheet resistance to approximately 25 ohms/square (which, again, is high for many applications).

By comparison, one structural embodiment, generally denoted 100, of the present invention is illustrated in perspective, cross section view in FIG. 2A. Device 100 comprises a body 110 of silicon semiconductor material having an upper surface 111 and a lower surface 112. Surfaces 111 and 112 are opposed major surfaces of a wafer and are normally substantially parallel to each other. Body 110 comprises an N+ drain region 114 which is disposed adjacent the lower surface 112 of the semiconductor body, and an N− drift region 116 disposed continuous to and above the drain region 114. A body region 118 of P type material extends into the drift region from the upper surface 111 of the semiconductor body. An N+ source region 120 extends into the body region 118 from upper surface 111 of the semiconductor body. An insulated gate electrode 131 is disposed on the upper surface 111 of the semiconductor body. Gate electrode 131 comprises an insulating layer 130 (preferably thermal oxide) disposed directly on the upper surface 111 of the semiconductor body and a conductive polycrystalline silicon layer 132 disposed on the oxide layer. Central to one aspect of the invention is the presence of a tungsten silicide layer 134 on the upper surface of polysilicon layer 132. Tungsten silicide layer 134 serves to provide the gate electrode with high lateral conductivity. In fact, the lateral conductivity of tungsten silicide layer 134 is sufficiently high that polycrystalline silicon layer 132 itself does not need to be highly conductive. This provides the advantage of minimizing or avoiding the tendency of a dopant (which would otherwise be used at high concentration to raise the conductivity of the polycrystalline silicon) to diffuse into or through the oxide layer 130, thereby adversely affecting interfacial electronic properties and degrading device yield. Tungsten silicide layer 134 has a further advantage of producing gate sheet resistance values greatly lower than those obtainable with the prior art technique of heavily doping the polysilicon layer.

In another novel aspect, the invention comprises the disposition of a tungsten layer 136 in contact with source region 120 where it extends to the surface within the aperture defined by the gate electrode. Layer 136 serves to improve contact resistance to regions 120 and 118, thereby reducing device on-resistance, improving breakdown voltage, increasing the current handling capability, and optimizing frequency response of the device. Tungsten layer 136 is spaced from the gate electrode stack 131 by an interlevel dielectric 138, preferably an oxide layer. An overlying source metallization layer 140 makes ohmic contact to tungsten layer 136. Selective gate and source metallization using tungsten can also be performed using a sidewall dielectric spacer structure 141 as shown in FIG. 2B.

While the structure illustrated in the Figures is a vertical FET, this invention is applicable to any device having a similar structure, and in particular, is applicable to insulated gate bipolar transistors (IGBTs), to metal oxide semiconductor controlled thyristors (MCTs) and so forth. These other device types will include additional layers in a manner well known in the art. For example, an IGBT will have a P+ type substrate 114 instead of N+ as shown.

The cells of device 100 are shown and have been described as being parallel, elongated (straight stripe) cells. However, this invention is also applicable to cells of other shapes and configurations, including but not limited to rectangular, including square; hexagonal; round or elliptical, including circular; and so forth.

The device of FIG. 2A may be produced in accordance with a novel fabrication process whose steps are illustrated in FIGS. 3A-3I.

Referring now to FIG. 3A, the beginning of a process for producing the device 100 is shown. In FIG. 3A, a semiconductor wafer 110 has an upper surface 111 and a lower surface 112. The surfaces 111 and 112 are opposed major surfaces of the wafer 110. Adjacent the lower surface 112 is an N+ layer 114 which forms the drain region of the final device. The remainder of the wafer in FIG. 3A is a lightly doped N type (N−) layer 116 which, in the final device, comprises the drift region of the device.

Figure 3B:
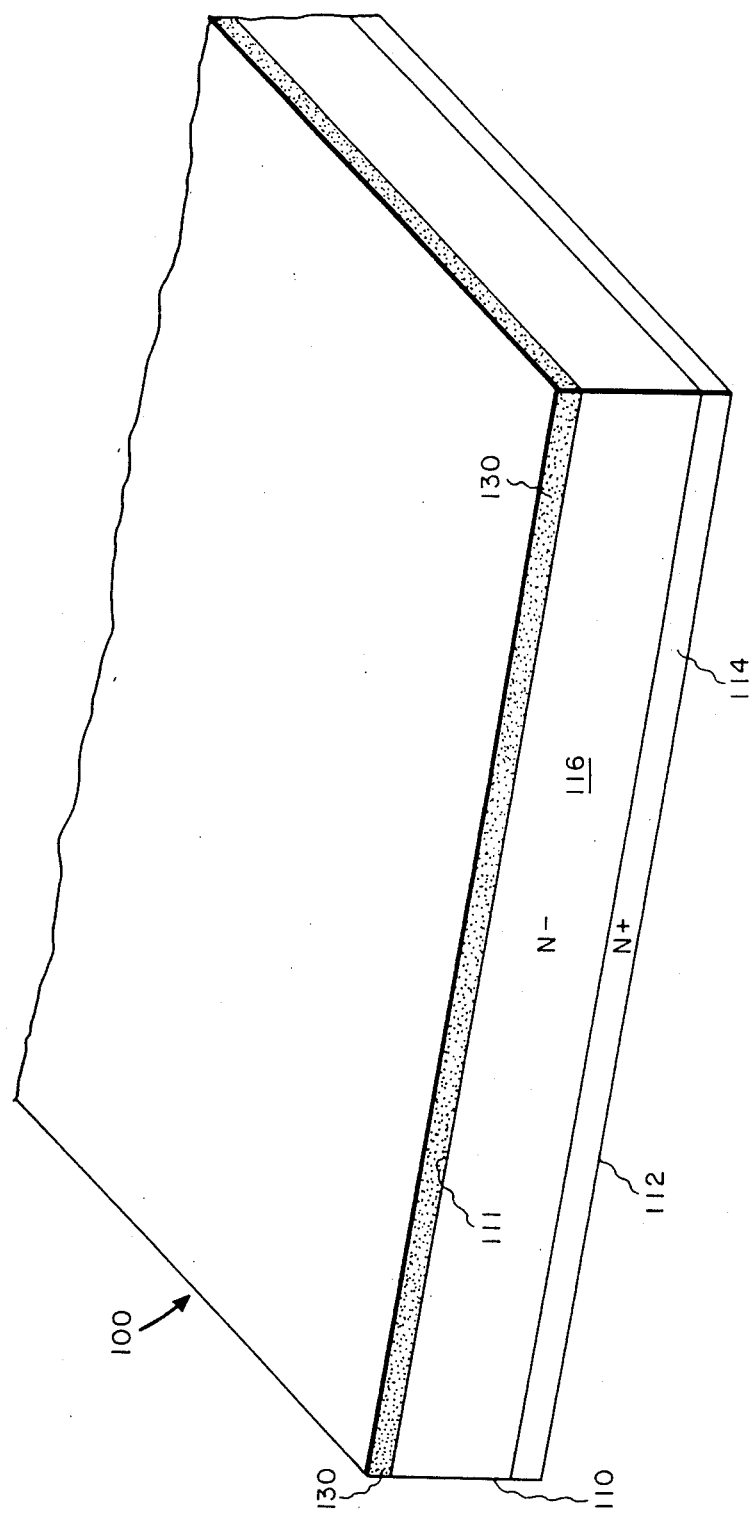

In FIG. 3B, the upper surface of the wafer has been thermally oxidized in a manner well known in the art to form a 500–1000 angstrom thick thermal oxide layer 130 across the entire upper surface of the wafer 110. Thereafter, in FIG. 3C, a substantially uniform layer 132 of polycrystalline silicon has been deposited on top of the oxide layer. The polycrystalline silicon may preferably have a thickness of 4000 to 8000 angstroms and may be deposited in any well-known manner, such as by pyrolytic decomposition of silane ($SiH_4$) in a chemical vapor deposition system.

Figure 3D:
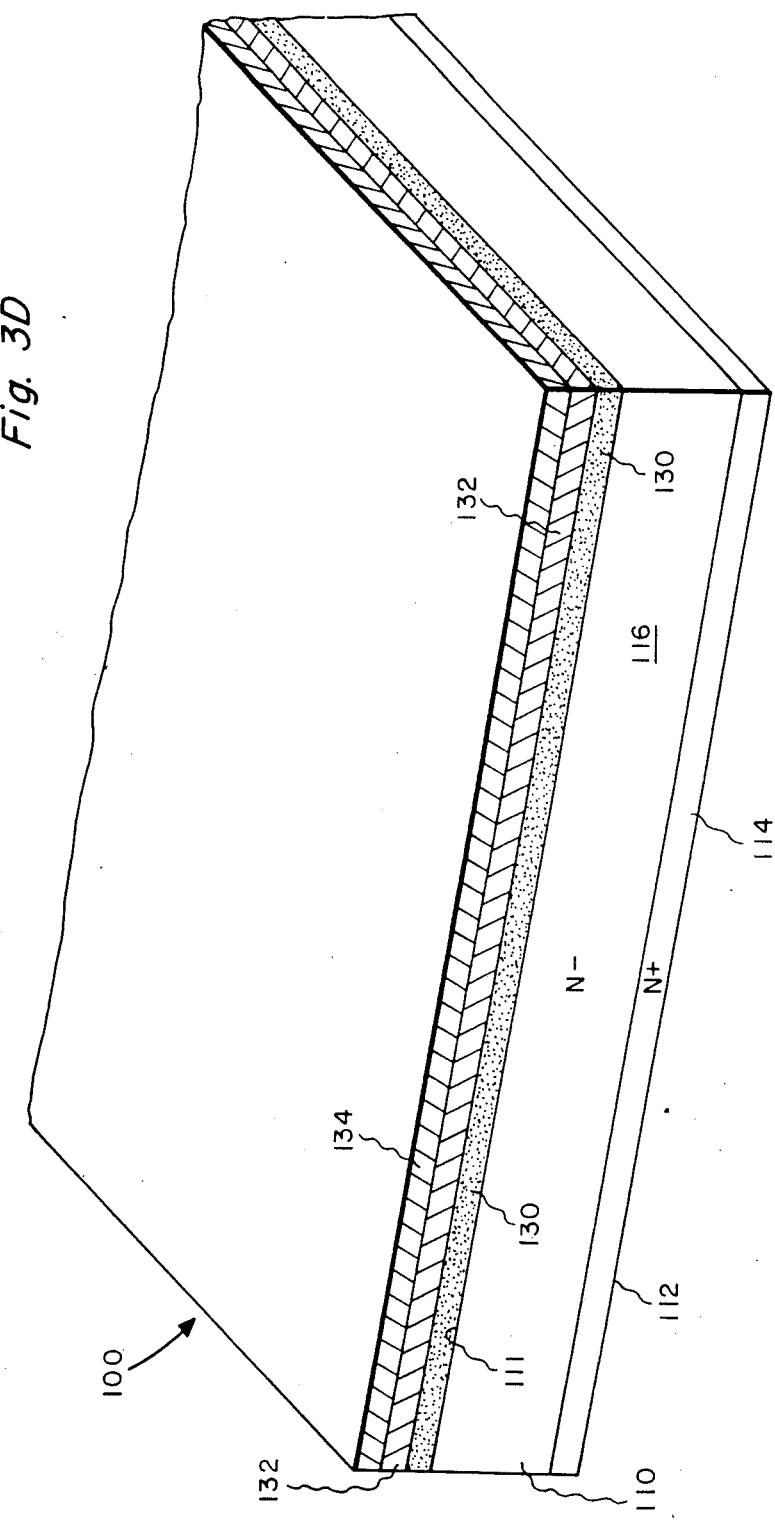

Subsequent to deposition of polysilicon layer 132, a tungsten silicide layer 134 is formed on layer 132, preferably by low pressure chemical vapor disposition (LPCVD) (see FIG. 3D). Tungsten silicide layer 134 is approximately 3,000 angstroms thick and is initially deposited with an atomic ratio of silicon to tungsten of approximately 2.6:1. This silicon rich silicide is necessary because a certain amount of silicon will outdiffuse and be lost to the silicide during subsequent high temperature processing of the semiconductor device to form oxide or nitride. Tungsten silicide layer 134 is highly conductive, and as deposited is microcrystalline and has a sheet resistance of approximately 14 ohms per square.

The initial microcrystalline structure of silicide layer 134 allows for easy pattering of the layer. Important to the fabrication method of the present invention is a two step stack etch process. As shown in FIG. 3E, silicide layer 134 is initially patterned and etched away in a first ambient gas to form a window 170 at the bottom of which the upper surface of polysilicon layer 132 is exposed. The second etch of the two step process is to remove polysilicon layer 132 and oxide layer 130 in a different ambient gas. A second gas is necessary to attain the desired substantially vertical silicide/polysilicon/oxide stack surfaces at the edges of window 170' (see FIG. 3F). A number of different etch gas combinations can be used. For example, silicide layer 134 can be removed using a $SF_6$ plasma with parameters as follows: flow, 40 sccm; pressure, 50 mTorr; and power, 300 W (0.25 W/cm$^2$). One method of etching layers 132 and 130 following reactive-ion-etching of silicide layer 134 in $SF_6$ plasma is to expose the surfaces in an HCl plasma with etched parameters of: flow, 20 sccm; pressure, 20 mTorr; and power 200 W (0.25 W/cm$^2$). The preferred process, however, is obtained using a $Cl_2$ plasma in the second etch of layers 132 and 130 following selective removal of layer 134 using reactive-ion-etching in $CBrF_3$. The parameters for these etchings are: flow, $10^3$ sccm/80 sccm (respectively); pressure, 50 mTorr; and power 300 W (0.25 W/cm$^2$). This etch chemistry provides nearly vertical sidewalls with minimal resist erosion. Polysilicon sidewalls with controlled etch profiles that are non-reentrant result in improved wafer yield especially for large area power FETs with gate peripheries on the order of several meters.

Following the stack etch removal process of FIGS. 3E and 3F, a two step dry etch sequence, known in the art, is used to dry clean silicon surface 111 and remove any residual surface damage. Following this, diffusion of a P+ body region 118 through window 170' is accomplished in the normal manner. Region 118 can be formed by implanting 140 keV, $6 \times 10^{13} - 1 \times 10^{14}$ boron atoms/cm$^2$ and diffusing at temperatures ranging from 1050° C. to 1100° C. for varying durations in nitrogen or argon to obtain a range of P base profiles. Preferably, the wafer is first capped with a layer of thermally grown oxide at 950° C. prior to high temperature base drives in order to preserve the silicide surface morphology and limit silicon out diffusion from the silicide and polysilicon films. The silicide can also be capped by a layer of dielectric deposited at low processing temperatures. Alternatively, the silicide may be annealed by rapid thermal processing. After forming region 118, the wafer is coated with a layer of photoresist which is patterned to leave a central segment of the photoresist centered in the window 170', as shown in FIG. 3G. Next, a heavy concentration of an N type dopant is implanted through the reduced window into the surface of semiconductor body 110. Thereafter, the photoresist is stripped from the wafer and the wafer is heated to drive the source region 120 into semiconductor body 110. The device at the end of this wellknown processing is shown in FIG. 3H.

Significant improvement in the ohmic contact resistance to source region 120 (e.g., by two orders of magnitude) is obtained by using an arsenic implant in place of heretofore known implants, such as phosphorous. Because of defect enhanced diffusion mechanisms, phosphorous generally gives a doping profile that is sharply peaked at the silicon surface and rapidly falls off into the silicon body. For a good ohmic contact, a high doping concentration is required not only at the silicon surface but also for at least a few hundred angstroms deep into the silicon block. It has been discovered that arsenic implants meet this need and, therefore, provide superior source contacts. Further, utilization of arsenic implants does not require any additional process complexities compared to standard phosphorous doped source regions. Implantation of arsenic can be used in all other discrete power devices and high voltage integrated circuit (HVIC) technology, as well as to form good drain ohmic contacts.

Thereafter, a 4,000 angstrom thick layer of low temperature oxide (LTO) is deposited over the wafer at a temperature of about 450° C. by low temperature chemical vapor deposition. This layer is preferably conformal, but need not be. The source gases may preferably be dichlorosilane and nitrous oxide. This low temperature oxide layer includes many pinholes. It is therefore densified at a temperature in the 800°–900° C. range in a nitrogen atmosphere for a period of from 30 to 60 minutes. After the completion of this densification, a second 4,000 angstrom thick layer of LTO is deposited on the wafer and densified in a similar manner in order to provide an 8,000 angstrom thick layer 138 (FIG. 3I) of dense, pinhole-free oxide. In our work, we have found that a single 8,000 angstrom thick layer of LTO does not densify as well as the two 4,000 angstroms thick layers with the result that the two layers are preferred. This is particularly true, since pinholes in the two separate layers are not likely to be aligned with each other.

Next, the upper surface of the wafer is coated with a layer of photoresist (not shown) which is patterned to provide a contact hole over the source and body regions 120 and 118. The wafer is then reactive-ion-etched in a known manner to expose said source and body regions.

Immediately upon removing the wafer from the reactive-ion-etching chamber, a layer of silicon oxide ($SiO_2$) forms over the exposed silicon due to a reaction with the oxygen in the air. In order to provide a low resistance ohmic contact between the source and the subsequently deposited metallization, the oxide in the contact regions must be removed. About 1000 angstroms of LPCVD tungsten is deposited selectively on exposed silicon. The oxide in the contact windows is etched by HF produced in the tungsten deposition system. The deposited tungsten serves several purposes. First, it prevents aluminum spiking which can otherwise result from the subsequent deposition or sintering of an aluminum metallization layer over the wafer. Second, it minimizes contact electromigration of the aluminum metallization. Third, it provides a clean silicon-tungsten interface with significantly reduced contact resistance. An aluminum metallization layer is then sputtered onto the wafer surface, preferably in the same sputtering chamber, but in a different sputtering chamber if desired. An aluminum thickness of about 3 microns is preferred. The aluminum may be pure aluminum or an aluminum silicon alloy, such as alusil, as is well known in the art. At the end of the aluminum sputtering step, the wafer appears as shown in FIG. 2A.

The drain metallization 142 shown in FIG. 2A may be applied in the same manner and at the same time as the source metallization. Preferably, however, the drain metallization is applied after the previously-described passivation on the source side of the wafer has been performed. This may require thinning the wafer, as by grinding, to a thickness of 15-7 mils prior to performing the drain metallization. Preferably, the drain also receives a layer of tungsten metal prior to contact metallization, again to improve ohmic contact resistance. Metallization contact to the gate electrode is provided in the usual manner at the periphery of the device active area and is not shown in the figures. At the completion of the device fabrication process, the wafer is diced into individual devices if multiple devices have been fabricated. Naturally, if a whole wafer device has been fabricated or the fabricated devices are to be used in their wafer form, the wafer is not diced.

It will be understood that other dielectrics and etchants than those described may be utilized provided they provide the desired effects at each stage in the process and during device operation.

Typically, measured room temperature reverse blocking characteristics of 50 V power FETs fabricated pursuant to the above described method show a sharp transition into avalanche breakdown regimen with a drain to source breakdown voltage, $V_{BD}$, of 45 V. Detailed characterization of dc parameters and device capabilities was performed using an automated measurement system and the results are tabulated in Table 1 below. As set forth therein, 50 V and 100 V devices fabricated pursuant to the invention were studied.

TABLE 1

| PARAMETER | UNIT | 50 V FET | 100 V FET |
| --- | --- | --- | --- |
| Unit Cell | μm | 11 | 20 |
| Cell Density | millions/inch$^2$ | 6.5 | 1.6 |
| $V_{BD}$ | V | 45 | 90 |
| $I_{GSS}$ | pA | 100 | 100 |
| $R_{on}$ | mΩ | 14 | 45 |
| Die Size | mil | 100 | 100 |
| $I_{D(on)}$ | A | 100 | >50 |
| $C_{ISS}$ | nF | 2.7 | 3.2 |
| $C_{OSS}$ | nF | 3.6 | 4.5 |
| $C_{RSS}$ | nF | 1.2 | 3.8 |
| $R_{sp}$ | mΩ — cm$^2$ | 0.88 | 2.8 |
| $C_{sp}$ | pF/cm$^2$ | 43,200 | 51,200 |
| $R_{on} \times C_{ISS}$ | pF × Ω | 38 | 140 |
| $t_r, t_f$ | ns | <2 | <2 | wherein:
$V_{BD}$ = breakdown voltage
$I_{GSS}$ = gate to source leakage current
$R_{on}$ = on resistance
$I_{D\ (on)}$ = drain to source current in on state
$C_{ISS}$ = input capacitance
$C_{OSS}$ = output capacitance
$C_{RSS}$ = Miller feedback capacitance
$R_{sp}$ = specific on resistance
$C_{sp}$ = specific input capacitance
$t_r, t_f$ = rise time and fall time, respectively, of output current or voltage.

The measured results listed in Table 1 correspond to an optimum cell design for each $V_{BD}$ and were extracted for measurements performed on an average of more than 100 devices distributed across 4 inch diameter silicon wafers. The measured $R_{on} \times C_{ISS}$ product shown in Table 1 represents the best values reported for any type of power FET in the 50 V and 100 V reverse blocking ranges. More than 40 percent improvement in $R_{on}$ was obtained for package devices when a large number of (for example 50) source bond wires were used to reduce the current crowding effects due to finite resistivity and dimensions of source metallization. The current crowding effect was negligible in smaller dies of 25 mil × 25 mil size.

The switching times listed in Table 1 were obtained under resistive switching conditions. Accurate measurement of turn-on and turn-off times was difficult when switching large amounts of current due to circuit parasitics. Significant loading of the gate driver circuitry by large input capacitance also added to The complexity. The switching times listed in Table 1 are in reasonable agreement with transient response calculated from a first order circuit model whose parameters were extracted from the measured dc and capacitance results. These devices were able to sustain an avalanche energy of at least 30 mJ when switching energy stored in inductive loads.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A multi-cellular, field effect, power semiconductor device comprising:
    a body of semiconductor material having opposed first and second major surfaces and a first region of one type conductivity extending to said first major surface, said first major surface being planar;

an insulated gate electrode layer disposed on said first major surface, said insulated gate electrode having a plurality of apertures therein;

said gate electrode layer including:

an oxide layer formed on said first major surface of said wafer, a polysilicon layer formed on said oxide layer, a tungsten silicide layer formed on said polysilicon layer, and said gate electrode's oxide layer, polysilicon layer and tungsten silicide layer having vertically aligned edge profiles;

a plurality of cells, each associated with one of said apertures in said gate electrode layer, each of said cells comprising:

a second region of opposite type conductivity extending into said first region from said first major surface beneath the gate electrode aperture for that cell, a third region of said one type conductivity disposed in said second region and extending to said first major surface, said second and third regions being self-aligned with respect to the gate electrode aperture for that cell, said second region including a channel portion disposed between said first and third regions, beneath said insulated gate electrode and self-aligned with respect to the gate electrode aperture for that cell, and said second and third regions having a layer of tungsten disposed thereon in ohmic contact therewith, said tungsten layer being self-aligned with respect to said aperture in said gate electrode and spaced from said gate electrode;

a layer of dielectric disposed over said body of semiconductor material and having a plurality of contact apertures therein, each of said contact apertures being situated over said tungsten layer of a different cell, said dielectric layer being disposed between said tungsten layer and said insulated gate electrode layer; and a layer of metallization disposed over said dielectric layer, extending into said contact aperture and into ohmic contact with each of said tungsten layers.

2. The multi-cellular, field effect, power semiconductor device recited in claim 1 wherein:

said device further includes a second layer of tungsten disposed on said second major surface and a second layer of metallization disposed on said second tungsten layer.

3. The multi-cellular, field effect, power semiconductor device recited in claim 2 wherein:

said second layer of metallization is in ohmic contact with said second layer of tungsten which is itself in ohmic contact with said one type conductivity material.

4. The multi-cellular, field effect, power semiconductor device recited in claim 2 wherein:

said first layer of metallization is in ohmic contact with said first layer of tungsten which is itself in ohmic contact with said opposite type conductivity material.

5. The multi-cellular, field effect, power semiconductor device recited in claim 1 wherein:

said second region is doped with boron and said third region is doped with arsenic. MS:nbK

* * * * *